(12) United States Patent
Hong et al.

(10) Patent No.: US 11,733,177 B2
(45) Date of Patent: Aug. 22, 2023

(54) METHOD FOR ESTIMATING TWIN DEFECT DENSITY

(71) Applicant: The Industry & Academic Cooperation in Chungnam National University (IAC), Daejeon (KR)

(72) Inventors: Soon-ku Hong, Sejong-si (KR); Si Trong Ngo, Daejeon (KR); Duy Duc Le, Daejeon (KR); Jungkuk Lee, Daejeon (KR)

(73) Assignee: The Industry & Academic Cooperation in Chungnam National University (IAC), Daejeon (KR)

( * ) Notice: Subject to any disclaimer, the term of this patent is extended or adjusted under 35 U.S.C. 154(b) by 486 days.

(21) Appl. No.: 17/256,885

(22) PCT Filed: Mar. 11, 2020

(86) PCT No.: PCT/KR2020/003338
§ 371 (c)(1),
(2) Date: Dec. 29, 2020

(87) PCT Pub. No.: WO2020/204381
PCT Pub. Date: Oct. 8, 2020

(65) Prior Publication Data
US 2021/0270753 A1    Sep. 2, 2021

(30) Foreign Application Priority Data
Apr. 5, 2019  (KR) .................. 10-2019-0040362

(51) Int. Cl.
*H01L 21/00*   (2006.01)
*G01N 21/95*   (2006.01)
(Continued)

(52) U.S. Cl.
CPC ......... *G01N 21/9505* (2013.01); *G01B 11/22* (2013.01); *G01N 21/8422* (2013.01);
(Continued)

(58) Field of Classification Search
CPC ........... G01N 21/9505; G01N 21/8422; G01N 2021/8477; G01B 11/22; H01L 22/24
(Continued)

(56) References Cited

U.S. PATENT DOCUMENTS

2012/0016630 A1*  1/2012  Shintani ................. G01B 11/22
                                                                  702/166

FOREIGN PATENT DOCUMENTS

JP        2010-223812 A     10/2010
JP        2011-027427 A      2/2011
(Continued)

OTHER PUBLICATIONS

International Search Report for PCT/KR2020/003338 dated Jul. 6, 2020 from Korean Intellectual Property Office.
(Continued)

*Primary Examiner* — Phuc T Dang
(74) *Attorney, Agent, or Firm* — Paratus Law Group, PLLC

(57) ABSTRACT

Disclosed is a method for estimating twin defect density in a single-crystal sample, including: (A) etching the observed surface of a single crystal to form etch pits; (B) selecting bar-shaped etch pits caused by twin defect; (C) from the long-axis direction lengths of the etch pits caused by twin defect, estimating the twin defect density by using the following equation: twin defect density=$\Sigma kx'_i$/area of sample, wherein $2 \leq k \leq 3$, and $x'_i$ is the long-axis direction length of an etch pit caused by the i-th twin.

10 Claims, 11 Drawing Sheets

(51) Int. Cl.
*G01B 11/22* (2006.01)
*G01N 21/84* (2006.01)
*G01N 21/956* (2006.01)
*H01L 21/66* (2006.01)

(52) U.S. Cl.
CPC ....... *G01N 21/95607* (2013.01); *H01L 22/24* (2013.01); *G01N 2021/8477* (2013.01)

(58) Field of Classification Search
USPC .......................................................... 438/14
See application file for complete search history.

(56) References Cited

FOREIGN PATENT DOCUMENTS

| | | | | |
|---|---|---|---|---|
| JP | 2011027427 A | * | 2/2011 | ............. H01L 22/24 |
| JP | 2011-124354 A | | 6/2011 | |
| JP | 2012-193069 A | | 10/2012 | |
| KR | 10-2012809 B1 | | 8/2019 | |

OTHER PUBLICATIONS

Korean Office Action for related KR Application No. 10-2019-0040362 dated May 23, 2019 from Korean Intellectual Property Office.

Young Jun Joo et al., "Microstructure analyses of aluminum nitride (AlN) using transmission electron microscopy (TEM) and electron back-scattered diffraction (EBSD)", Journal of the Korean Crystal Growth and Crystal Technology, Aug. 7, 2015, pp. 127-134, vol. 25, No. 4.

\* cited by examiner

(a) 5 min etching

(b) 15 min etching

(c) 60 min etching

METHOD FOR ESTIMATING TWIN DEFECT DENSITY

CROSS-REFERENCE TO PRIOR APPLICATIONS

This application is a National Stage Patent Application of PCT International Patent Application No. PCT/KR2020/003338 (filed on Mar. 11, 2020) under 35 U.S.C. § 371, which claims priority to Korean Patent Application No. 10-2019-0040362 (filed on Apr. 5, 2019), which are all hereby incorporated by reference in their entirety.

BACKGROUND

The present invention relates to a method capable of quantitatively evaluating the twin defect density of a large-area single crystal sample using a standardized method even by an unskilled person although expensive and complicated equipment is not used.

A power semiconductor is a semiconductor that performs control processing, such as a DC/AC conversion, a voltage control, and a frequency change, for the utilization of electric energy, and is a core part that determines whether to operate a product driven by electricity and performance of the product. The power semiconductor is widely used from household appliances to an elevator, a subway, and an industrial machine. New demands rapidly grow along with the growth of new industries, such as a smart grid, electric vehicles, and IoT.

An initial power semiconductor device was based on silicon (Si), but has reached its limits in technology development versus performance improvements due to an intrinsic limit of its physical properties. Accordingly, gallium nitride (GaN, 3.4 eV) and silicon carbide (4H—SiC. 3.3 eV) having a wide bandgap (WB) were proposed as alternatives. In particular, gallium nitride is widely used as a semiconductor device for a high frequency, high power and, a high temperature because it has excellent physical characteristics, such as a high threshold voltage, a high electron mobility, and a high electron saturation speed, compared to other semiconductor material. A currently commercialized gallium nitride power semiconductor device uses a hetero epitaxy thin film grown on a silicon substrate because a cheap large-area substrate is not easily supplied. For this reason, gallium nitride has problems in that a defect density is high and a threshold voltage is limited to a level of 600 to 900 V. In the case of silicon carbide, a 6-inch single crystal substrate was commercialized, but the substrate has disadvantages in that a substrate price is expensive, the processing is difficult due to high hardness, a processing process is complicated, and a cost is high because it is grown by a vapor growth method at a high temperature of 2800° C. or more.

Recently, gallium oxide ($Ga_2O_3$), having more excellent efficiency in terms of power performance compared to gallium nitride and silicon carbide, has been in the spotlight as a material for a next-generation power semiconductor device. Gallium oxide shows a wider ultra-wide bandgap (UWB) (4.9 to 5.1 eV) characteristic than gallium nitride, and can show a breakdown voltage characteristic of a gallium nitride or silicon carbide level even although the thickness of a film is thinly grown to a $\frac{1}{3}$ level of gallium nitride or silicon carbide. Furthermore, a fabrication cost can be reduced because a single crystal of gallium oxide can be grown using a melt growth method and gallium oxide can be doped at room temperature. Accordingly, a fabrication cost is economic because the fabrication cost of gallium oxide is a $\frac{1}{3}$~$\frac{1}{5}$ level compared to gallium nitride or silicon carbide, and thus gallium oxide has been in the spotlight as an ideal material for a power semiconductor because gallium oxide can be fabricated as a large-area substrate. Practically, it is expected that the gallium oxide substrate can be fabricated at a cheap price similar to a sapphire substrate in the future. In particular, it is expected that the gallium oxide substrate will be very useful for fields that require high power of a 100 kW class in which a breakdown voltage is 2 kV or more due to excellent physical properties compared to gallium nitride or silicon carbide.

In unlike conventional amorphous silicon, a crystal defect, such as the variation of a composition or instability of a structure attributable to multiplicity, may occur in a single crystal material. The crystal defect is classified according to a dimension of a form attributable to a defect. That is, a point defect (0-dimensional defect) means that another atom is located at a crystal lattice location or a vacancy is formed or an atom is located at a location not a crystal lattice. A line defect (1-dimensional defect) is a defect in which atoms are abnormally arranged because a line of atoms disappears or is warped in a crystal, and is commonly called a dislocation defect. An edge dislocation, a screw dislocation, etc. corresponds to the line defect. A twin defect is one of the plane defects (2-dimensional defects) and means that crystals are symmetrically arranged on the basis of a twin plane. In addition, a stacking fault or a grain boundary corresponds to the plane defect. If a precipitate is present within a crystal, this is called a bulk defect (3-dimensional defect). The crystal defect affects a mechanical strength, and also becomes a cause to degrade semiconductor characteristics, such as reducing a carrier mobility, increasing the leakage current, and reducing a threshold voltage. Accordingly, it is very important to analyze the type of defect and a degree of generation (defect density) according to a method of growing a single crystal or a single crystal thin film in developing a high-quality crystal growth technology by evaluating the effectiveness of a crystal growth method and optimizing a crystal growth condition.

A method of measuring the defect density of a single crystal or a single crystal thin film includes several methods, such as a cathode luminescence method, a time resolved photoluminescence method, an etching method, an X-ray topography, and TEM or AFM observation. Among them, the etching method is to observe an etch pit, formed by etching, using an optical microscope. A person other than a skilled person can measure a defect in a large-area single crystal or a single crystal thin film according to a standardized method by the etching method. Accordingly, Japanese Patent Application Publication No. 4758492 disclosed a method of measuring a maximum depth, an average depth, depth curvature, etc. of an etch pit and measuring a defect density for each type of defect by determining the type of defect related to each etch pit based on the measured results. However, in conventional technology, a defect density calculated from an etch pit is limited to a dislocation defect, that is, an one-dimensional defect. The defect density for the dislocation defect is calculated from the sum of lengths of dislocation lines present in a total volume of a sample that is considered, and may be calculated as the sum of dislocation line lengths/volume. However, if the dislocation line vertically threads from the bottom of the sample (such dislocation is called a threading dislocation), the length of the dislocation line and the height of the sample become identical and are offset. As a result, the dislocation density is calculated as the number of etch pits generated at the dislocations per unit area, and a unit thereof is $cm^{-2}$. Kasu, etc. (Jpn. J. Appl. Phys 56, 091101 (2017)) calculated a defect density, included in single crystal gallium oxide, from an etch pit, and evaluated the association with electrical characteristics, but such a method is also limited to a dislocation defect. Lebedev, etc. (Physica B 404 (2009) 4758) reported that various crystal defects may greatly increase at the boundary of a twin defect. Up to now a method of analyzing a twin defect density using an X-ray topography was suggested. However, the method has problems in that expensive equipment needs to be used, a radiation accelerator facility that is difficult to be equipped in a company or experimental laboratory level is used, and an analysis is possible by only skilled personnel. If analysis is performed using a TEM, there is a problem in that the method is limitedly available only when the twin defect density is high because an observable area in TEM analysis is limited to a very small region. A simple method capable of measuring the defect density of a twin defect, such as the generation of an etch pit, has not yet been proposed so far.

SUMMARY

An object of the present invention is to provide a method capable of quantitatively evaluating the twin defect density of a large-area sample even by an unskilled person using a standardized and simple method although expensive equipment is not used.

In the present invention for achieving the object, a method of evaluating a twin defect density of a single crystal sample includes the steps of (A) forming etch pits by etching an observation plane of a single crystal; (B) selecting an etch pit according to a twin defect; and (C) evaluating a twin defect density using an equation below from a long-axis direction length of the etch pit according to the twin defect, The twin defect density=$\Sigma k x'_i$/the area of the sample, wherein $2 \leq k \leq 3$, $x'_i$ is the long-axis direction length of the etch pit based on an i-th twin defect.

The etching may be performed by processing the sample using an etching solution, such as a strong acid or a strong alkali, at a high temperature. The etching solution may include a phosphoric acid, a hydrochloric acid, KOH, etc., for example, but is not limited thereto. The etch pit is a groove generated because a portion having a defect within a crystal is more rapidly etched upon etching, and shows a different aspect depending on a defect. So far, the etch pit has been researched by focusing a dislocation defect, and no attempt has been made to quantitatively evaluate an etch pit at a twin defect or the twin defect density using an etch pit.

As a result of analysis of the etch pit, the etch pit using a twin defect showed a bar shape. According to additional analysis, as an etching time increased, a width, that is, a length in a short-axis direction, was increased, but a length in a long-axis direction was not changed. As described in detail in the following embodiments, the density of a twin defect can be calculated from the sum of the long-axis direction lengths from etch pits included in a sample.

The single crystal sample may be a gallium oxide single crystal substrate or a gallium oxide single crystal thin film. A single crystal substrate for growing the epi layer of gallium oxide includes (010), (100), (001) and (−201) substrates. Among them, the (100) substrate has low effectiveness as a substrate for single crystal growth because the growth rate of an epi layer is too slow. In the case of the (010) substrate, the growth rate of an epi layer is not slow, but the (010) substrate has a limit in being applied to a device for mass production because the size of a currently available substrate is 10 mm×15 mm. The (001) substrate has a slightly slower growth rate in the case of molecular beam epitaxy, but is now most useful in the growth of an epi layer because a 2-inch size substrate has been commercialized. In the case of the (−201) substrate, a 6-inch substrate has now been commercialized, and growth of epi layer with a moderate growth rate is also available, but the (−201) substrate has a problem in that a twin defect occurs. Accordingly, the method of the present invention may be used to evaluate the twin defect density in a gallium oxide epi layer grown in the gallium oxide (−201) substrate, in particular. According to the method of the present invention, the usefulness of the gallium oxide (−201) substrate can be increased because the method can be usefully used to optimize a growth condition for a gallium oxide epi layer so that the twin defect generation is reduced in the gallium oxide (−201) substrate. A long-axis direction of an etch pit according to a twin defect in the gallium oxide epi layer grown in the gallium oxide (−201) substrate is the [010] direction.

As described above, the twin defect density evaluation method of the present invention can be usefully used to analyze a single crystal or single crystal thin film sample because the twin defect density can be quantitatively evaluated by simply etching the sample and observing the sample by using an optical microscope.

Accordingly, the twin defect density evaluation method may be efficiently used for the setting of an optimized condition, which can reduce a twin defect in a crystal or thin film growth condition for fabricating a semiconductor device, for example.

The gallium oxide (−201) substrate can be produced as a large-area substrate having a 6-inch size when it is used as a thin film for growing a gallium oxide epi layer, has an economic feasibility, and is advantageous in applying the gallium oxide (−201) substrate to industrialization in terms of the growth rate of an epi layer on a substrate, but has a problem in that the twin defect density in the epi layer is high. Accordingly, a method of evaluating the twin defect density according to the present invention is very useful, in particular, in developing a gallium oxide epi layer growth method using the gallium oxide (−201) substrate.

DETAILED DESCRIPTION

Hereinafter, the present invention is described in detail with reference to attached embodiments. However, such embodiments are only illustrative in order to easily describe the contents and range of the technical spirit of the present invention, and the technical range of the present invention is not limited by the embodiments. Furthermore, various modifications and changes based on the examples within the range of the technical spirit of the present invention will be evident to those skilled in the art.

EMBODIMENT

Embodiment 1: Fabrication of Gallium Oxide Thin Film

Commercial gallium oxide (−201) substrates was washed by ultrasonic waves stirring for 10 minutes sequentially using acetone, methanol and deionized water (DI water). The washed substrate was chemically washed using a solution with volume ratio of 1:1:4 mixture of deionized water, 30% oxygenated water and 96% sulfuric acid for 5 minutes. The substrate was additionally washed using deionized water, and dried using nitrogen gas. The dried substrate was introduced into a plasma-assisted molecular beam epitaxy growth chamber, and was prepared by thermal cleaning the substrate at 850° C. for 30 minutes using oxygen radicals generated by excited plasma using RF power of 300 W and an oxygen gas flow rate of 2 sccm.

Element gallium (Ga) having a purity of 7N was supplied through a Sumo effusion cell made by Veeco Co. of USA into a plasma-assisted molecular beam epitaxy growth chamber on which the substrate was mounted. A gallium oxide thin film was grown using a plasma-assisted molecular beam epitaxy method by generating and supplying oxygen radicals by plasma by supplying oxygen to a plasma cell made by SVAT Co. of USA. A thin film growth condition is as follows; substrate temperatures of 650-850° C., an oxygen gas flow rates of 1-3 sccm, Ga flux of 0.1 Å/s, a thin film growth time for 180 minutes, growth chamber pressure of about $2 \times 10^{-9}$ Torr before the gas was introduced, and pressures of $2 \times 10^{-5}$ Torr-$4 \times 10^{-5}$ Torr during the growth.

Embodiment 2: Evaluation of Characteristics of Gallium Oxide Epi Thin Film

Prior to the evaluation of a crystal defect, it was first checked that the gallium oxide epi thin film was grown by the molecular beam epitaxy method of Embodiment 1.

1) Crystal Structure Analysis Through XRD, RHEED and Cross-Sectional TEM Analysis The crystal structure of the thin film grown by Embodiment 1 was analyzed using reflection high energy electron diffraction (RHEED) and X-ray scattering analysis (XRD, X-ray diffraction).

Figure 1:
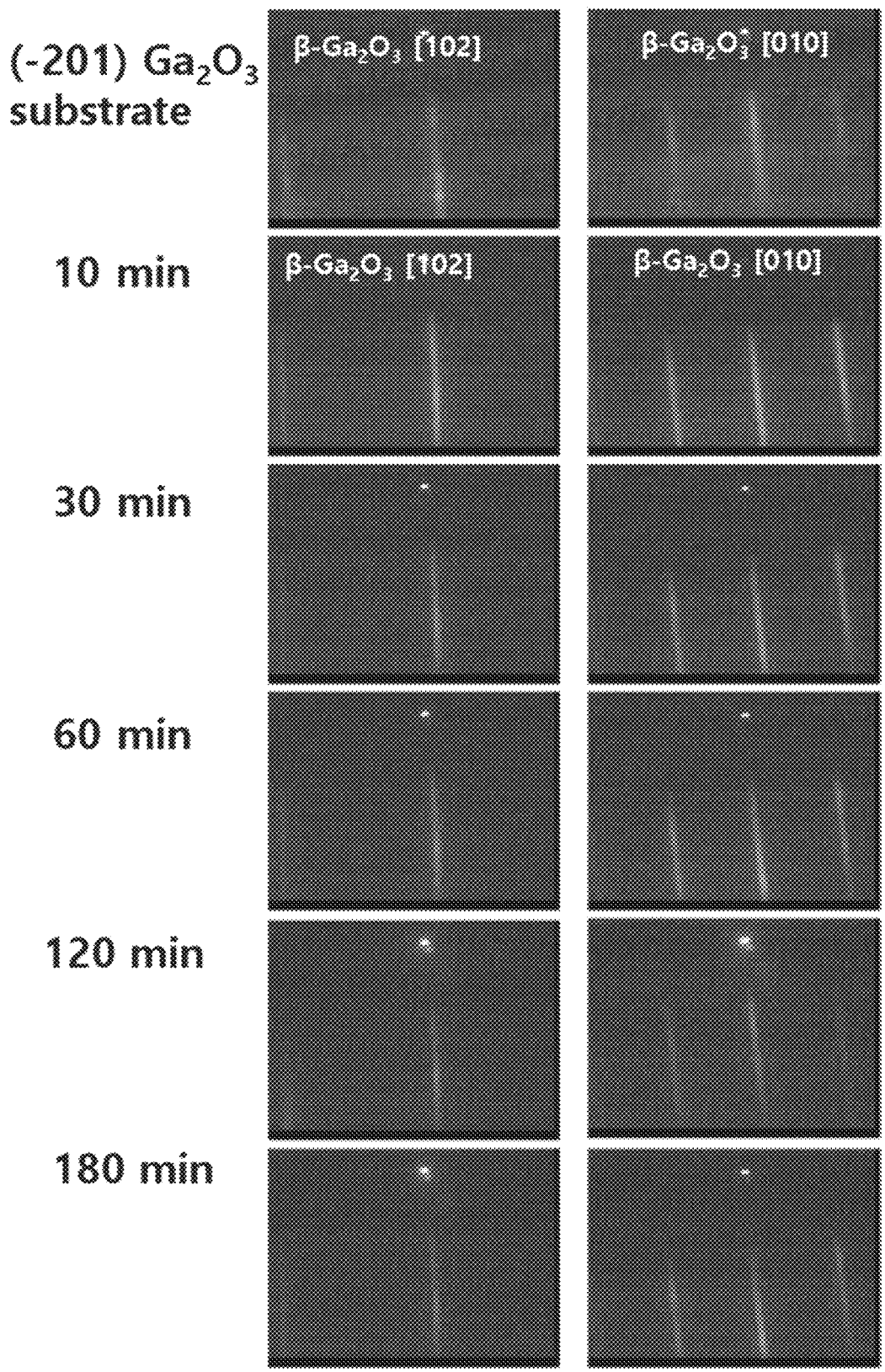
FIG. 1 show images illustrating RHEED patterns of a gallium oxide thin film according to an embodiment.
Figure 2:
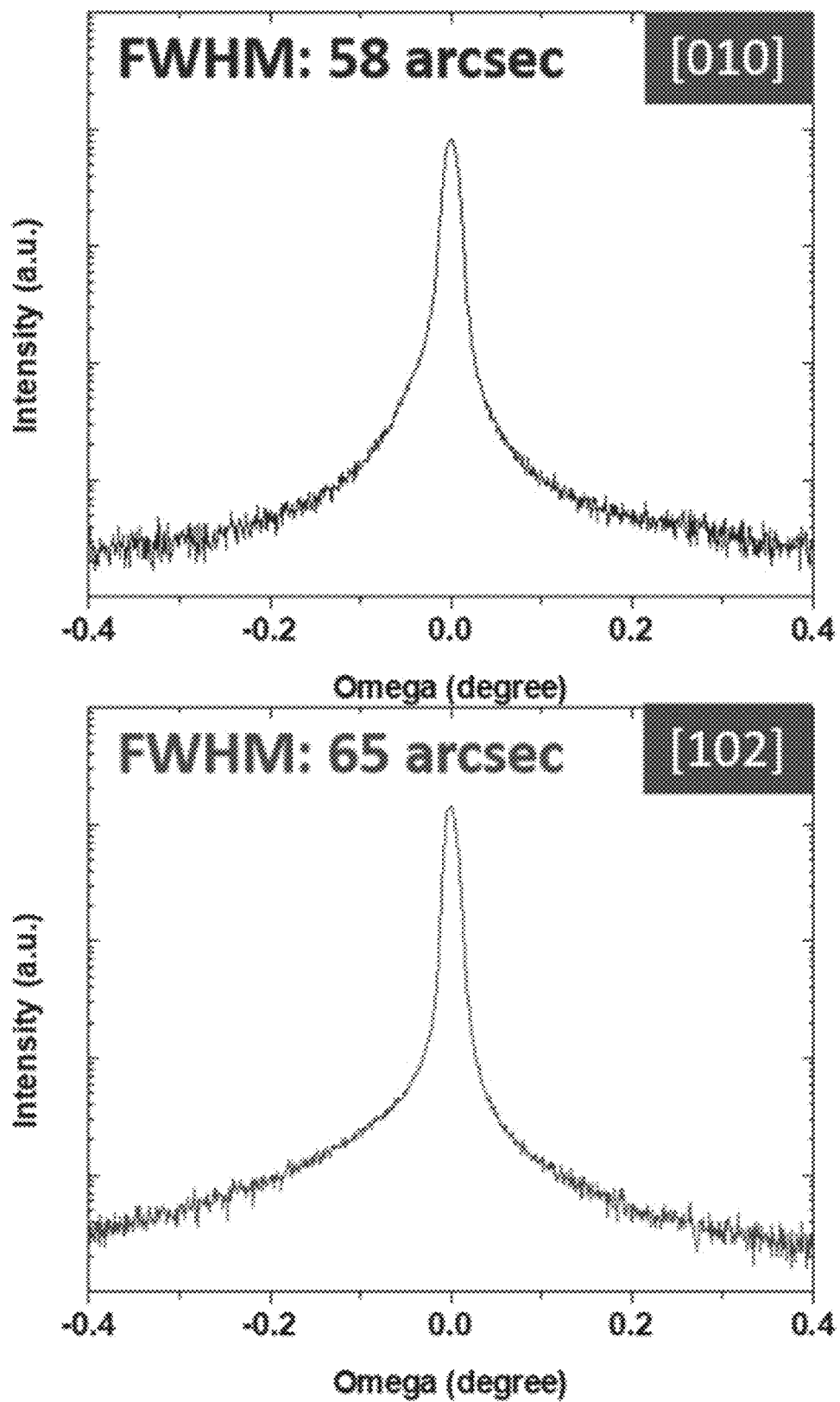
FIG. 2 is XRC of the gallium oxide thin film according to an embodiment.

The RHEED was analyzed under a condition with an electronic voltage of 18 kV and a beam current of 39 µA. The XRD was analyzed under conditions with Kα X-ray of Cu wherein λ=1.5406 nm, a voltage of 40 kV, a current of 40 mA, a scan step of 0.02, and a step time of 0.5 s, by using D8 Discover model made by Bruker AXS Co. of Germany. FIG. 1 illustrates RHEED images of the thin film with growth times. FIG. 2 illustrates X-ray rocking curves (XRCs) for a (−402) along the [010] and the [102] directions in the thin film grown for 180 minutes. The results of FIGS. 1 and 2 show that the thin film grown by Embodiment 1 has a monoclinc crystal structure and excellent crystallizability.

Figure 3:
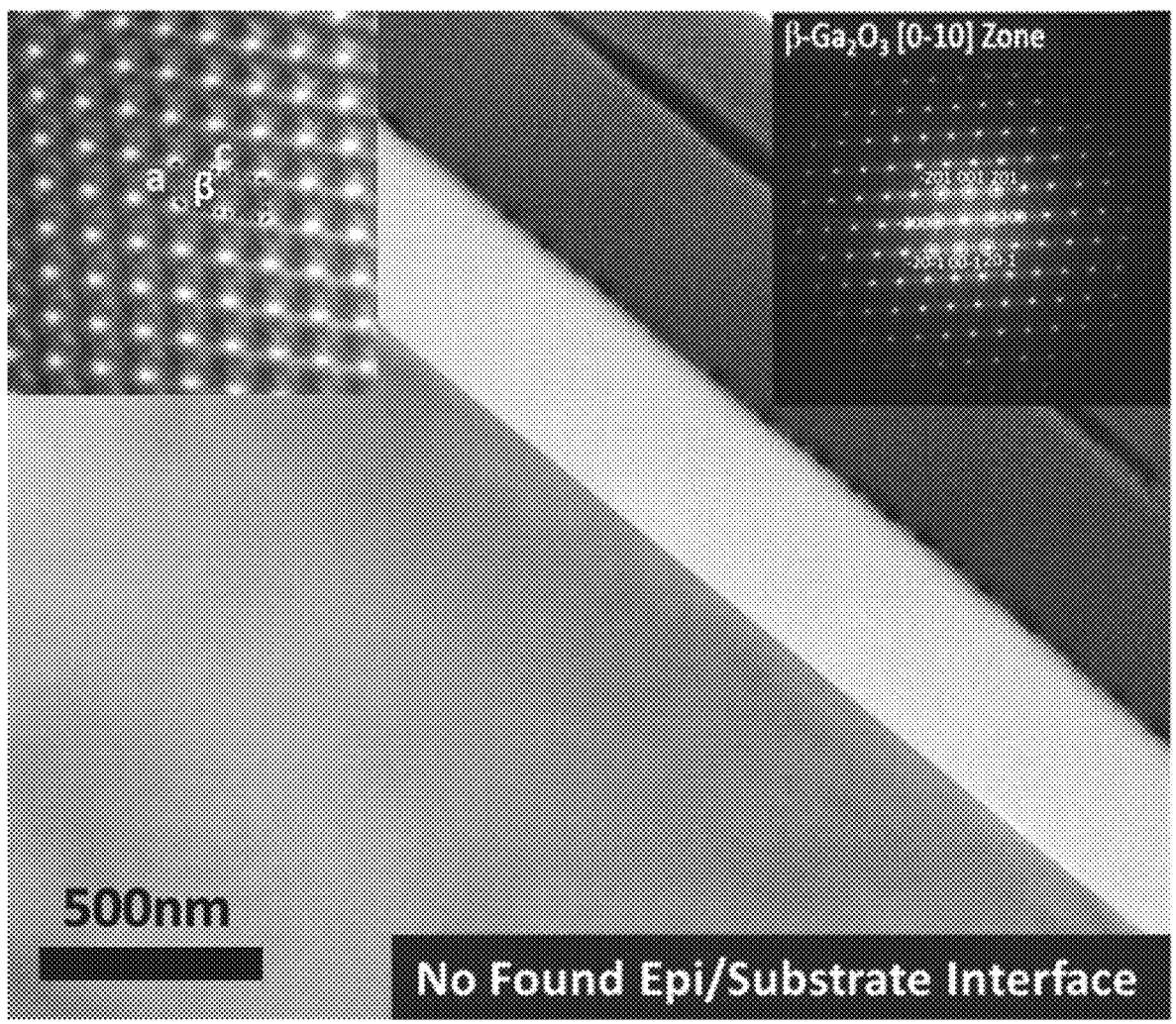
FIG. 3 is a Cross-sectional TEM image of the gallium oxide thin film according to an embodiment.

FIG. 3 illustrates an X-TEM image of the thin film, and shows that an interface was not observed between the substrate and the epi layer and likewise has excellent crystallinity.

2) Measurement of Surface Roughness of Thin Film

Figure 4:
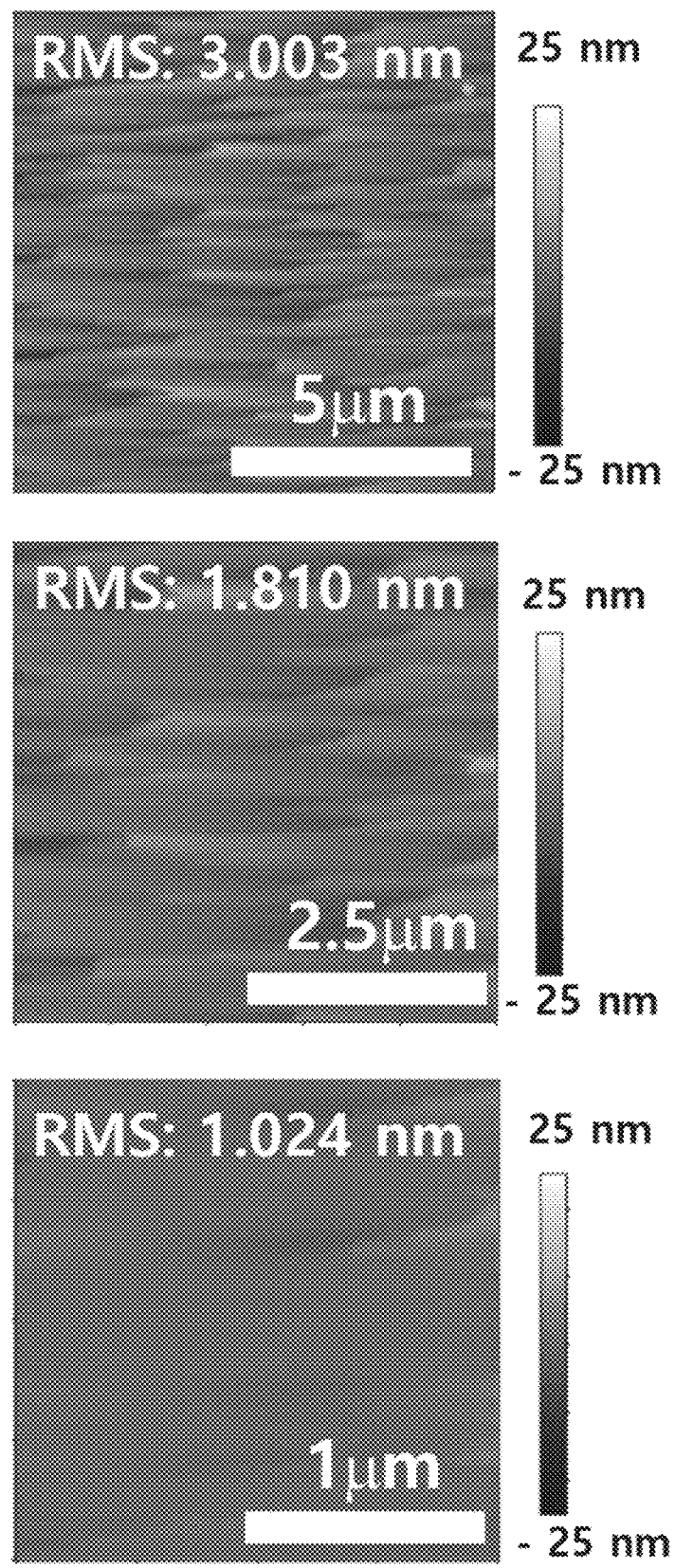
FIG. 4 shows AFM images of the gallium oxide thin film according to an embodiment.

Surface roughness was measured based on a root mean square roughness by using an atomic force microscope (AFM, MFD-3D model of Asylum Research Col.) value under conditions with scan areas for 10 µm×10 µm, 5 µm×5 µm, and 2 µm×2 µm, a scan speed of 1 Hz, and a driving frequency of 70 kHz from the thin film. FIG. 4 illustrates AFM images showing surface roughness of the gallium oxide thin film grown for 180 minutes, and sequentially illustrates the AFM images for scan areas of 10 µm×10 µm, 5 µm×5 µm, 2 µm×2 µm from the top. It can be seen that flat root mean square (RMS) roughness of about 1 nm level from the scan area of 2 µm×2 µm.

Embodiment 3: Etch Pit Analysis

Figure 5:
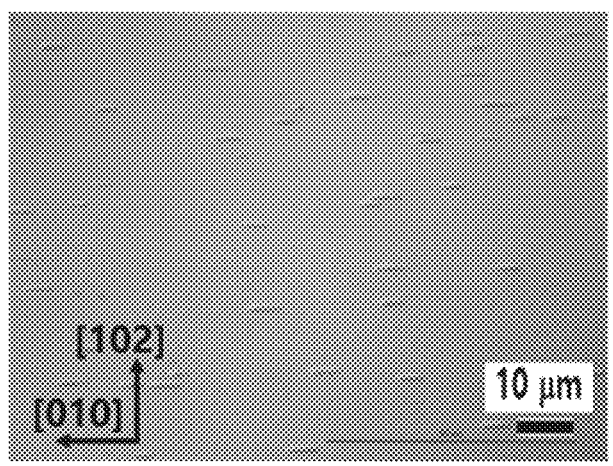
FIG. 5 shows optical microscope images of the gallium oxide thin film according to an etching time.
Figure 5:
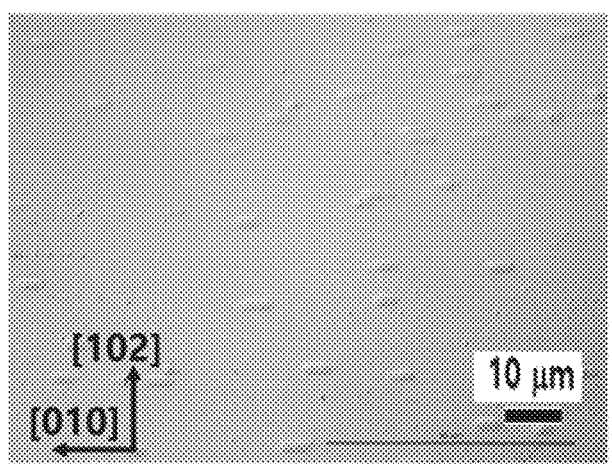
Figure 5:
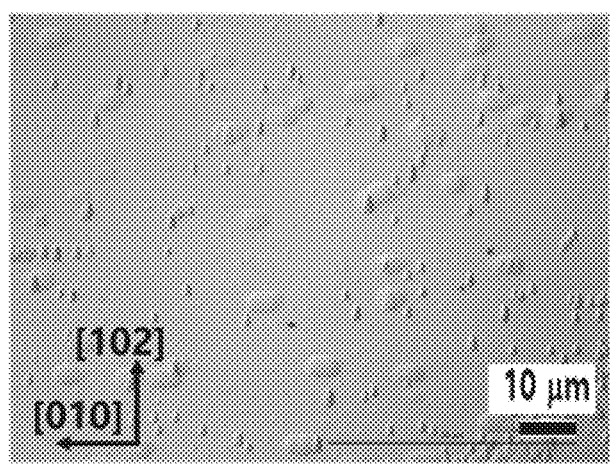

The gallium oxide epi layer fabricated using the method of Embodiment 1 was etched using a phosphoric acid at 130° C., and an etched surface was observed using an optical microscope. The observation using the optical microscope was performed at 1000× magnification using Eclipse LV100ND model of Nikon Co. FIG. 5 illustrates optical microscope images with different etching time, and illustrates that the bar-shaped etch pits were mostly observed when etched for 5 minutes, but the bullet-shaped etch pits were formed along with the bar-shaped etch pits as the etching time was increased. Accordingly, the origin of each etch pit was analyzed.

1) Bullet-Shaped Etch Pit

Figure 6:
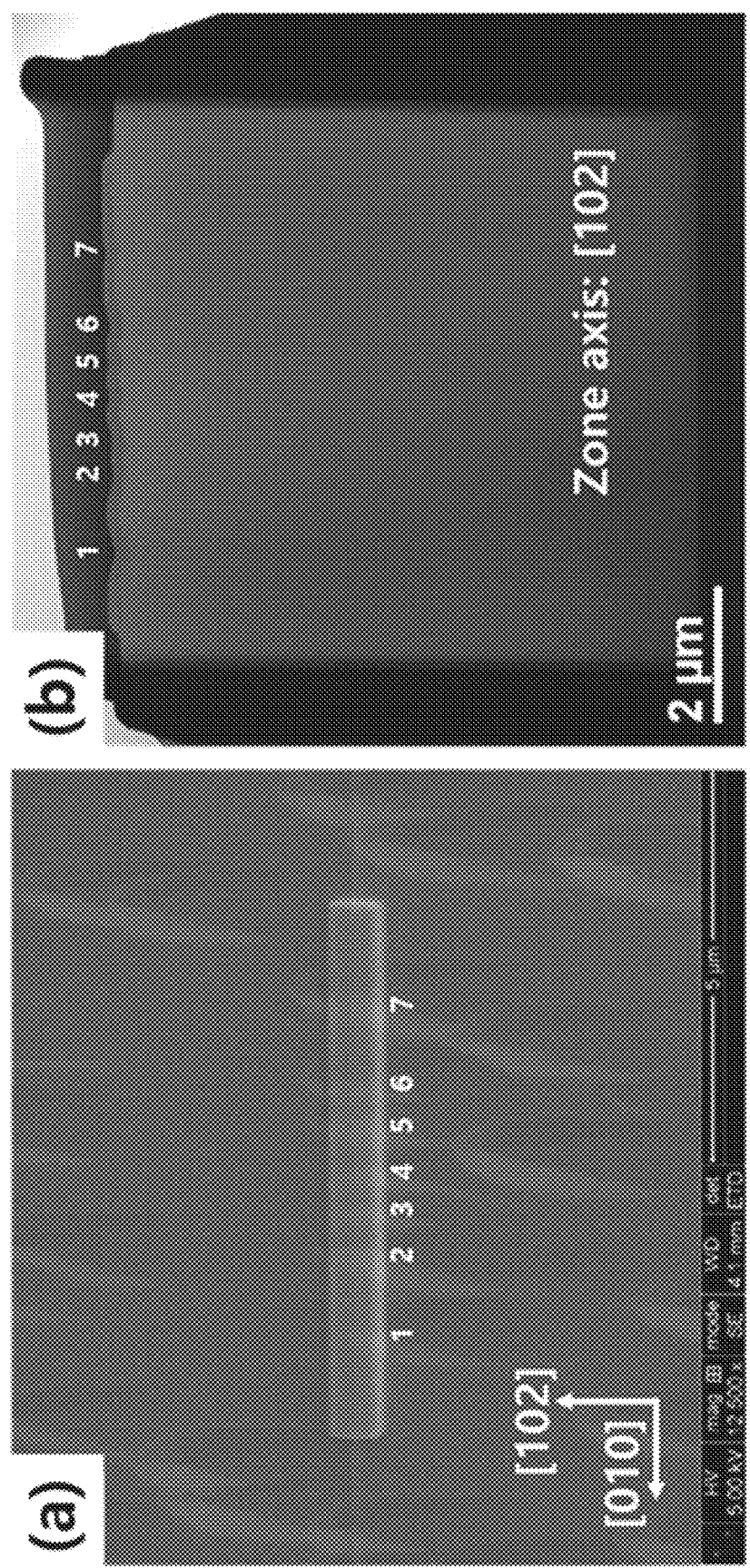
FIG. 6 shows SEM and TEM images of a gallium oxide thin film fragment.
Figure 7:
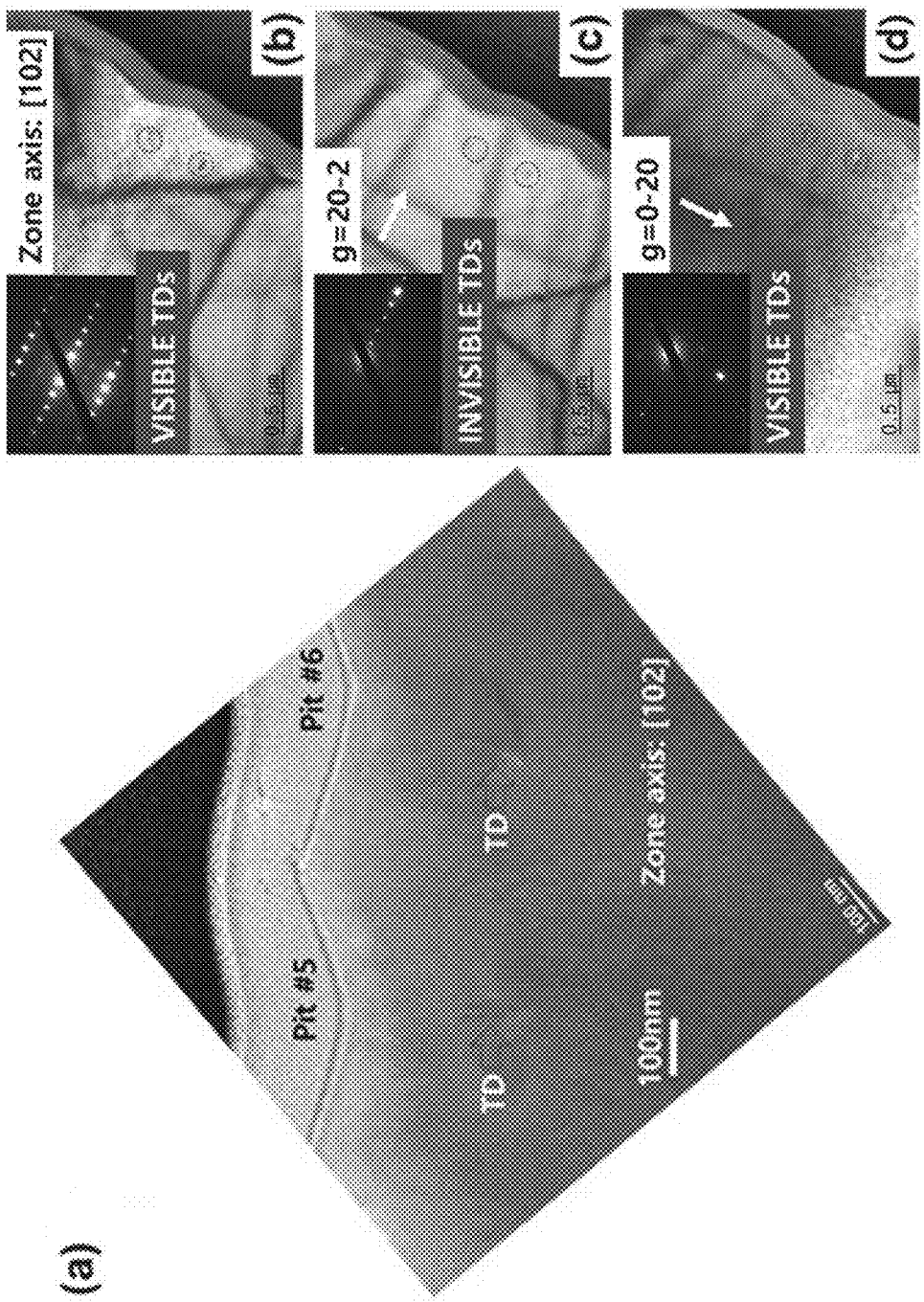
FIG. 7 shows TEM images for investigating the origin of a bullet-shaped etch pit.

In order to confirm the origin of the bullet-shaped etch pit generated by etching and placed along the [102] direction of a single crystal gallium oxide epi layer surface, a TEM specimen was fabricated using a focused ion beam (FIB) method, and was observed using a TEM. FIG. 6(a) illustrates a SEM image during a process of fabricating a cross-sectional TEM specimen using the FIB method, and FIG. 6(b) is a low magnification cross-sectional bright field TEM image showing selected etch pits of the cross-sectional TEM specimen finally completed in FIG. 6(a) process. FIG. 7(a) is a cross-sectional bright field TEM image for the fifth and sixth etch pit portions in FIG. 6(b). It can be seen that the origin of the bullet-shaped etch pit is a threading dislocation (TD). FIGS. 7(b) to 7(d) illustrate two-beam analysis results for threading dislocation analysis. FIG. 7(b) is a bright field image under the zone axis, 7(c) is with a diffraction vector of g=20-2, and 7(d) shows the image observed under the diffraction vector of g=0-20. According to a visible/invisible condition of the dislocation, it can be seen that the Burgers vector of threading dislocation is [010]. Accordingly, the type of threading dislocation is analyzed as an edge dislocation.

2) Bar-Shaped Etch Pit

In FIG. 5, the number of etch pits was not changed with increasing the etching time for the bar-shaped etch pit lengthily formed along the [010] direction. A thickness of the bar-shaped etch pit in a [102] direction was increased, but a length in the direction was not changed.

Figure 8:
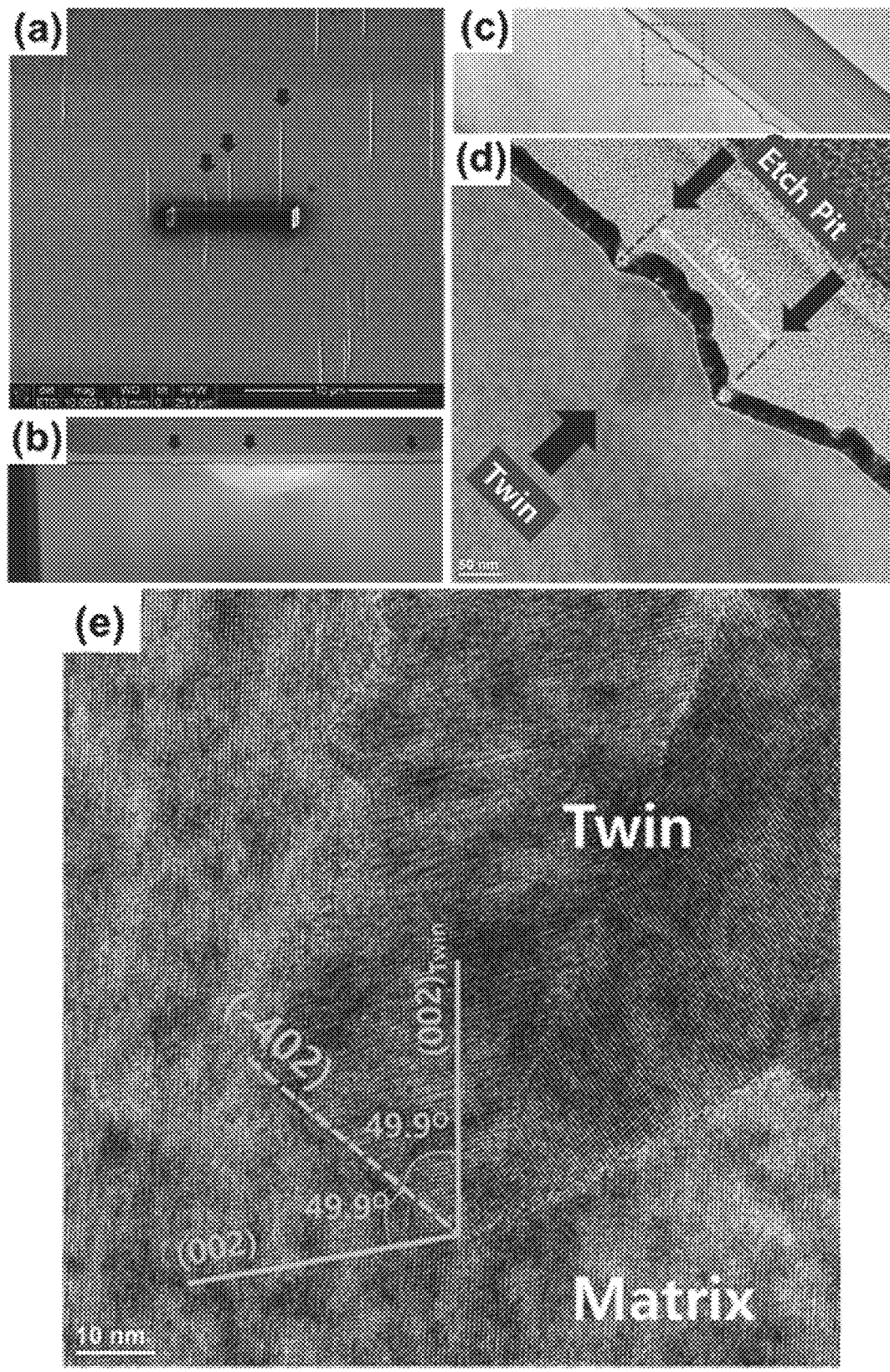
FIG. 8 shows SEM and TEM images for investigating the origin of a bar-shaped etch pit.

FIG. 8(a) is an SEM image during the process of fabricating the cross-sectional TEM specimen using the FIB method. FIG. 8(b) is a low magnification cross-sectional bright field TEM image showing three etch pits of the cross-sectional TEM specimen finally completed in FIG.

8(a). FIG. 8(c) is a cross-sectional bright field TEM image showing the first etch pit of FIG. 8(b). FIG. 8(d) is a high magnification bright field TEM image of the etch pit of FIG. 8(c), and shows that the etch pit was formed at the location where the boundary of a twin defect met a surface of the epi layer. It can be seen that a pair of etch pits are observed as one etch pit in the optical microscope of FIG. 5 or in the SEM image of FIG. 8(a). A distance between the pair of etch pits was about 190 nm. FIG. 8(e) is a high resolution TEM photograph of a twin crystal portion, and shows that a matrix and a defect portion have a twin crystal relation (mirror plane symmetrical). It can be seen that the corresponding defect is a twin defect.

Figure 9:
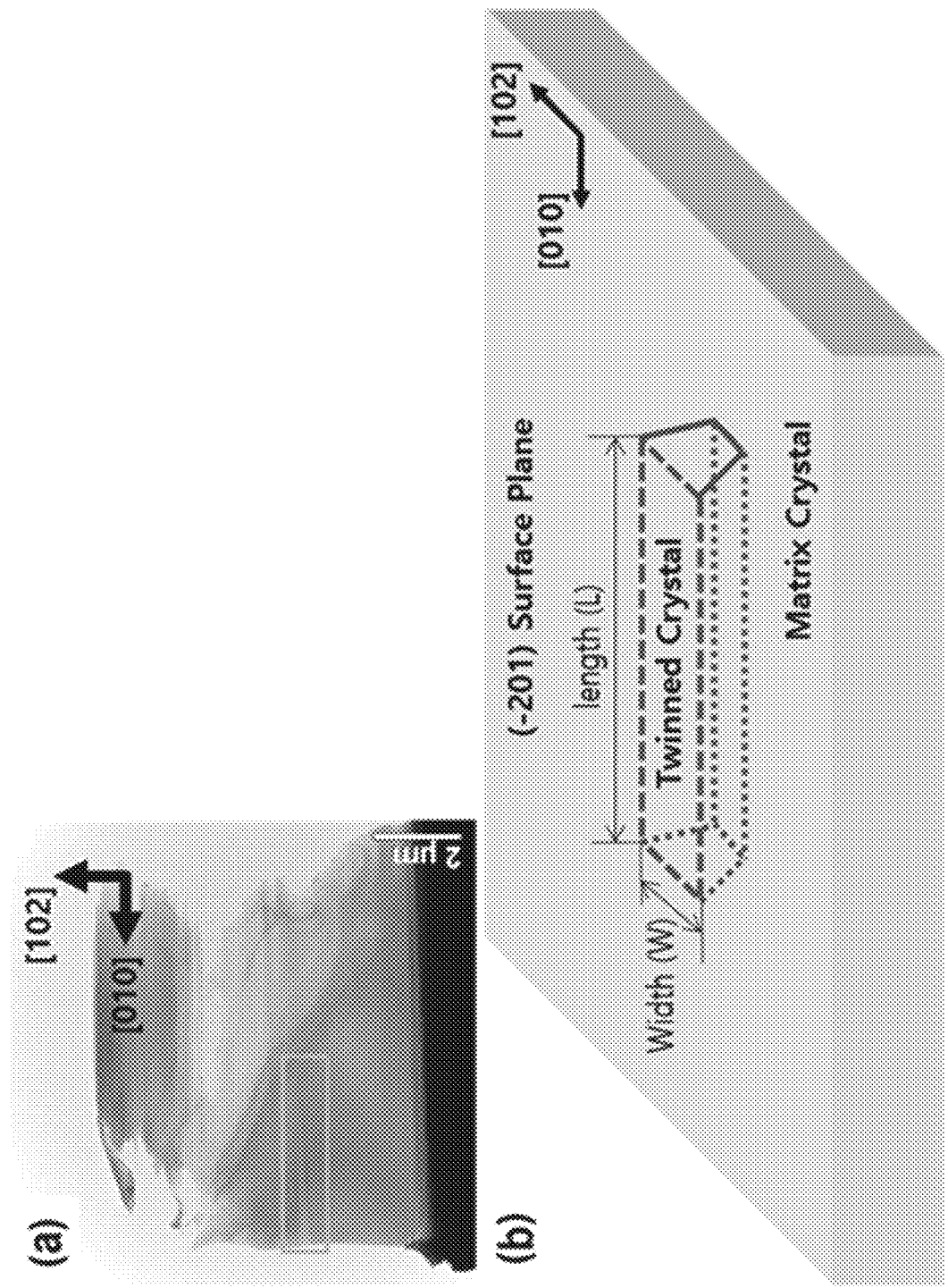
FIG. 9 shows a plane-view TEM image and a schematic diagram illustrating a twin defect.

FIG. 9(a) is a low magnification TEM photograph from (−201) plane-view specimen prepared by using the FIB method. In this case, a twin defect (rectangular portion) lengthily present in the [010] direction is shown. A shape of the twin defect present within the sample was schematically shown in FIG. 9(b) based on the cross-sectional TEM observation results of FIG. 9(d) for the twin defect and the plane-view observation results of FIG. 9(a).

Figure 10:
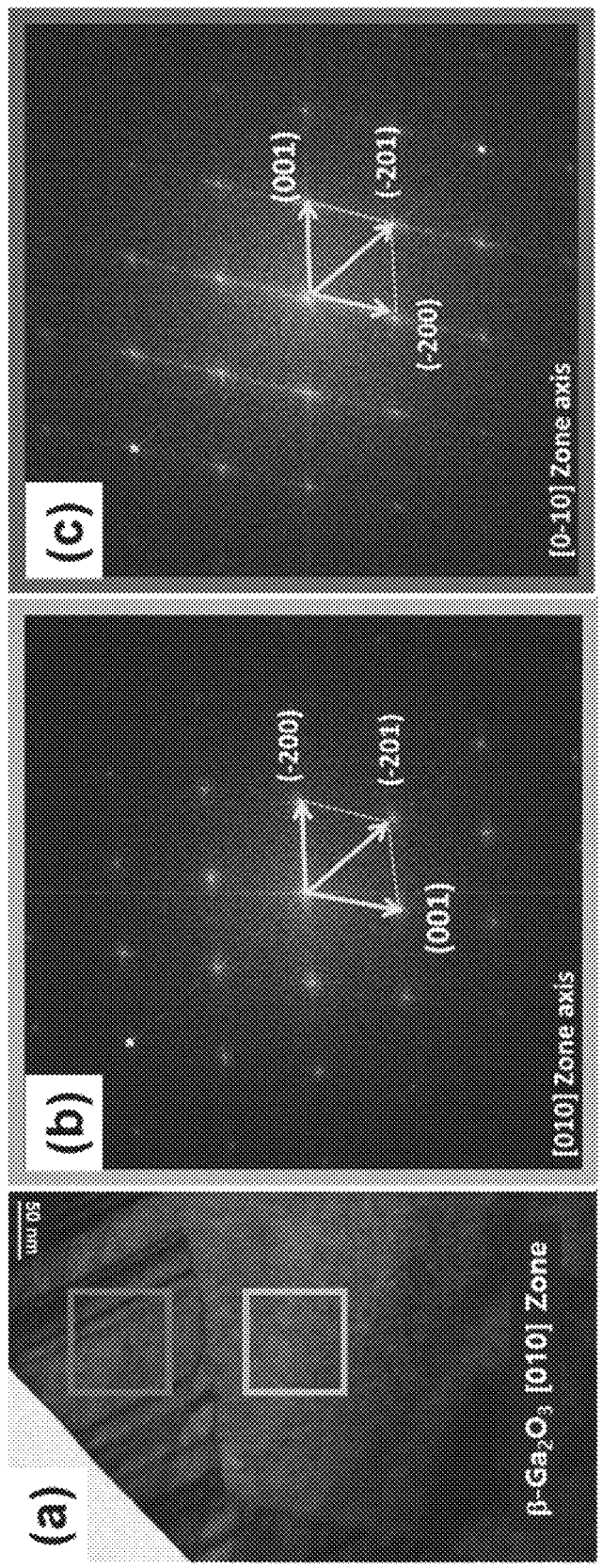
FIG. 10 shows TEM images for investigating the origin of a bar-shaped etch pit.

FIG. 10 illustrates additional results showing that the corresponding defect is a twin defect. FIG. 10(a) is a cross-sectional bright field TEM image of a defect region generated in the gallium oxide epi layer. FIG. 10(b) shows a diffraction pattern in a normal crystal matrix. FIG. 10(c) is a diffraction pattern of the defect region. Comparing the diffraction patterns of FIGS. 10(b) and 10(c), the matrix and the defect region have a twin crystal relation, and the defect corresponds to a twin defect.

3) Calculation of Twin Defect Density

In conventional technology, a method of calculating a dislocation defect density from an etch pit has been known, but to calculate a twin defect density has not been known. In particular, in the case of a gallium oxide (−201) substrate, a large-area substrate can be easily supplied, and a growth rate of a gallium oxide epi layer is fast, but has a drawback in that the generation of a twin defect in the epi layer is high. If a twin defect can be quantitatively evaluated, it is more effective to develop a method of growing an epi layer with superior crystal quality by decreasing the twin defect. Accordingly, a method of quantitatively calculating a twin defect density from an observed etch pit was developed.

Figure 11:
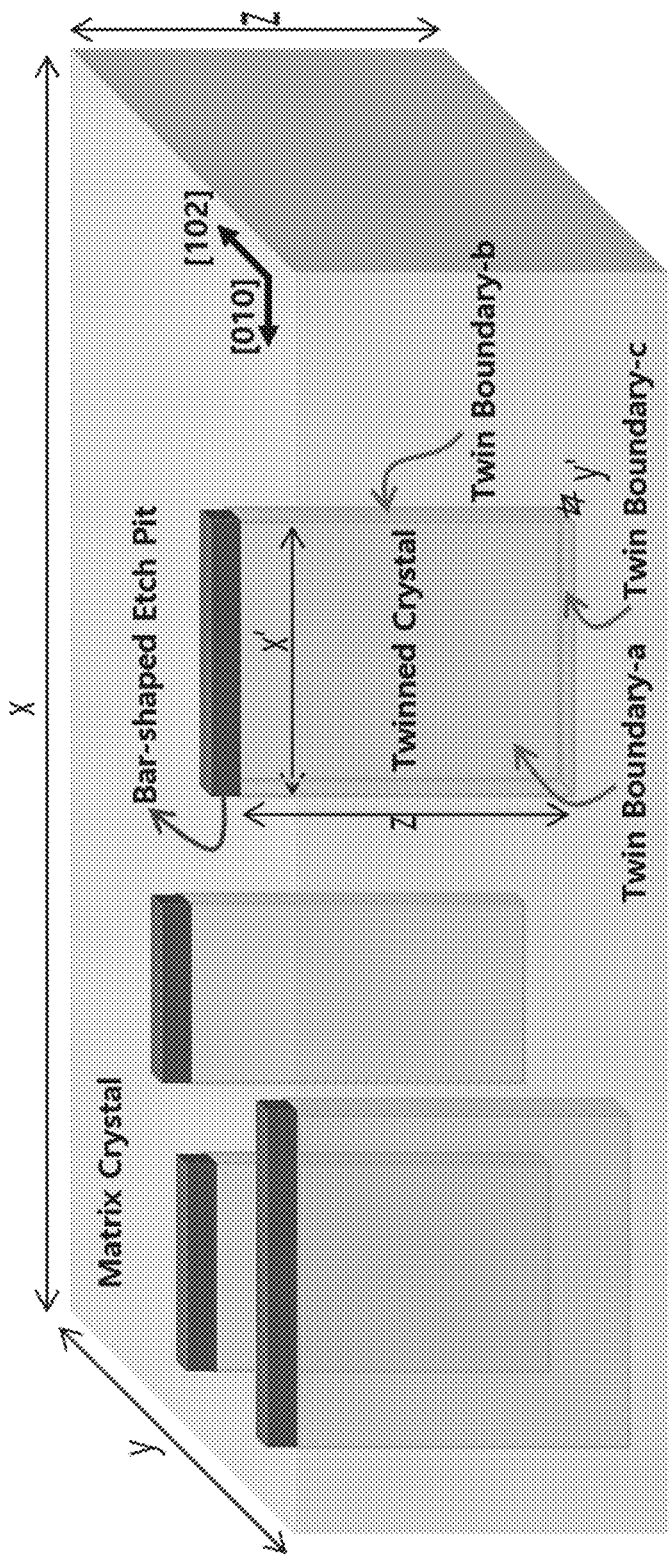
FIG. 11 is a schematic diagram illustrating a twin defect-caused etch pit.

FIG. 11 is a schematic diagram showing twin defect-caused etch pits. In the twin defect, a boundary between the twinned crystal and the matrix acts as a defect, and thus a defect density may be calculated from the area of a boundary of a twinned crystal. One boundary area TWB-S1 of the twin defect in a sample having a total volume of V (V=xyz) is defined as follows.

x' is approximately an order of 10 μm unit, and y' is several hundreds of nm unit, x'>>y', Accordingly, TWB-S1=2x'z+2y'z+x'y'=2(x'+y')z+x'y'∼2x'z+x'y'=x'(2z+y').

Since 0<y'≤z,

TWB-S1=kx'z (2≤k≤3)

For example,

1) If the sample is a substrate, z>>y' because z is a thickness of the substrate and has a very large value.

TWB-S1=x'(2z+y')∼2x'z, that is, k converges on 2.

2) If the sample is a thin film, z∼y' because z is a level similar to y', that is, a thickness of the thin film.

TWB-S1=x'(2z+y')∼3x'z, that is, k converges on 3.

The sum of a twin defect density TWBD in the sample=a sum of twin crystal boundary area in the sample/the volume of the sample=Σkx'$_i$z/xyz=Σkx'$_i$/xy (2≤k≤3)

That is, the twin defect density in the sample may be simply calculated from the sum of lengths of bar-shaped etch pits at twin defects and a surface area of the etched sample. If the sample has a constant thickness and only a specific condition for forming the thin film is changed, k may be considered as being a constant. Twin defect densities can be quantitatively compared by only calculating the sum of lengths of etch pits per unit area.

The invention claimed is:

1. A method of evaluating a twin defect density of a single crystal sample, comprising steps of:
    (A) forming etch pits by etching an observation surface of a single crystal;
    (B) selecting an etch pit according to a twin defect; and
    (C) evaluating a twin defect density using an equation below from a long-axis direction length of the etch pit according to the twin defect,
    wherein the twin defect density=Σkx'$_i$/the area of the sample, and
    wherein 2≤k≤3, x'$_i$ is the long-axis direction length of the etch pit based on an i-th twin defect.

2. The method of claim 1, wherein:
    the etch pit according to the twin defect in the step (B) has a bar shape,
    in the etch pit, a width that is a short-axis direction length is increased according to a lapse of an etching time, but a long-axis direction length is not changed.

3. The method of claim 1, wherein:
    k=2 if the single crystal sample is a substrate, and
    k=3 if the single crystal sample is a thin film.

4. The method of claim 1, wherein the single crystal sample is a gallium oxide single crystal or a gallium oxide single crystal thin film.

5. The method of claim 4, wherein the gallium oxide single crystal thin film is an epi layer formed on a gallium oxide (−201) single crystal substrate.

6. The method of claim 5, wherein the long-axis direction of the etch pit according to the twin defect is a [010] direction.

7. The method of claim 2, wherein:
    k=2 if the single crystal sample is a substrate, and
    k=3 if the single crystal sample is a thin film.

8. The method of claim 2, wherein the single crystal sample is a gallium oxide single crystal or a gallium oxide single crystal thin film.

9. The method of claim 8, wherein the gallium oxide single crystal thin film is an epi layer formed on a gallium oxide (−201) single crystal substrate.

10. The method of claim 9, wherein the long-axis direction of the etch pit according to the twin defect is a [010] direction.

* * * * *